United States Patent [19]

Arima

[11] Patent Number: 4,745,258
[45] Date of Patent: May 17, 1988

[54] APPARATUS FOR LASER-CUTTING METAL INTERCONNECTIONS IN A SEMICONDUCTOR DEVICE

[75] Inventor: Junichi Arima, Itami, Japan

[73] Assignee: Mitsubishi Denki Kabushiki Kaisha, Tokyo, Japan

[21] Appl. No.: 2,264

[22] Filed: Jan. 12, 1987

Related U.S. Application Data

[62] Division of Ser. No. 769,768, Aug. 27, 1985.

[51] Int. Cl.$^4$ ............................................. B23K 26/00
[52] U.S. Cl. ........................ 219/121 LG; 219/121 FS
[58] Field of Search .................. 219/121 LG, 121 LN, 219/121 LE, 121 LF, 121 FS, 121 L R

[56] References Cited

U.S. PATENT DOCUMENTS

| | | | |
|---|---|---|---|
| 3,584,183 | 6/1971 | Chiaretta | 219/121 LJ |
| 3,772,496 | 11/1973 | Harendza-Harinzma | 219/121 FS X |
| 4,021,898 | 5/1977 | Willis et al. | 219/121 FS X |
| 4,182,024 | 1/1980 | Cometta | 219/121 LH X |
| 4,476,375 | 10/1984 | Ogawa | 219/121 LN |

OTHER PUBLICATIONS

B. K. Aggarwal, et al., *IBM Technical Disclosure Bulletin*, "Laser Cutting Metal Through Quartz", vol. 22, No. 5, Oct. 1979, pp. 1971-1972.

*Primary Examiner*—C. L. Albritton
*Attorney, Agent, or Firm*—Lowe, Price, LeBlanc, Becker & Shur

[57] ABSTRACT

In apparatus for cutting metal interconnections in a semiconductor device according to the present invention, a semiconductor wafer (5) which has metal interconnections having a high melting point is placed in an oxygen atmosphere (9) within a chamber (6), and laser beams (4) are irradiated through an optical system (2) and an optical beam positioner (3) on the high melting point metal interconnections while maintaining the interior at the chamber (6) in a vacuum of 1 to 10 mTorr., and introducing oxygen from an oxygen inlet port (7) under a pressure of 1 to 1.5 Torr. to sublimate and cut the high melting point metal interconnections.

5 Claims, 2 Drawing Sheets

APPARATUS FOR LASER-CUTTING METAL INTERCONNECTIONS IN A SEMICONDUCTOR DEVICE

This is a division of application Ser. No. 769,768 filed Aug. 27, 1985.

BACKGROUND OF THE INVENTION

1. Field of the Invention

The present invention relates to apparatus for cutting metal interconnections in a semiconductor device. More specifically, it relates to an improvement in apparatus for laser-cutting metal interconnections formed on a semiconductor wafer in a semiconductor device.

2. Description of the Prior Art

A well-known method of cutting metal interconnections formed on a semiconductor wafer by laser beams is disclosed in "Laser Targeting Considerations in Redundunt Memory Repair", reported by D. Smart, R. Reilly, B. Wells et al. in Proc. Spie Int. Soc. Opt. Eng. (USA) Vol. 385, January 1983, pp. 97–101.

FIG. 1 is a conceptual schematic diagram showing a conventional laser trimming device. In FIG. 1, a laser beam 4 emitted from a laser beam source 1 is supplied through an optical system 2 to an optical beam positioner 3. The laser beam 4 emitted from the laser beam source 1 is supplied to the optical beam positioner 3 through the optical system 2 for the following reason: the energy of the laser beams directly emitted from the laser beam source 1 depends on the characteristics of crystals in the laser beam source 1 which is implemented by, e.g., a solid laser. Such energy is not constant and must be set as appropriate beam energy by the optical system 2. The optical beam positioner 3 is adapted to control positions of the laser beam 4 to be irradiated on metal interconnections, having a high melting point, which is formed on a semiconductor wafer 5. The high melting point metal interconnections formed on the semiconductor wafer 5 are cut by the irradiated laser beams 4.

In the conventional laser trimming apparatus, structured in the aforementioned manner, the high melting point metal interconnections are made molten and then are cut by the laser beams 4 in the atmosphere, whereby hot splashes of the molten metal interconnections are scattered and cause a short circuit between adjacent interconnections on the semiconductor device and damage in adjacent circuits.

SUMMARY OF THE INVENTION

Accordingly, the principal object of the present invention is to provide apparatus for cutting metal interconnections in a semiconductor device, in which hot splashes of molten metal interconnections having a high melting point exert no influence on adjacent interconnections and circuits.

Briefly stated, the apparatus according to the present invention makes cuts at selected locations on a semiconductor wafer formed with metal interconnections having a high melting point. These metal interconnections are cut in an atmosphere which is capable of sublimating the metal interconnections heat by laser beams, thereby to cut the high melting point metal interconnections.

Thus, according to the present invention, the high melting point metal interconnections are processed in an atmosphere that can sublimate and cut the same by laser beams, whereby no hot splashes are caused to influence adjacent interconnections and circuits.

The above and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
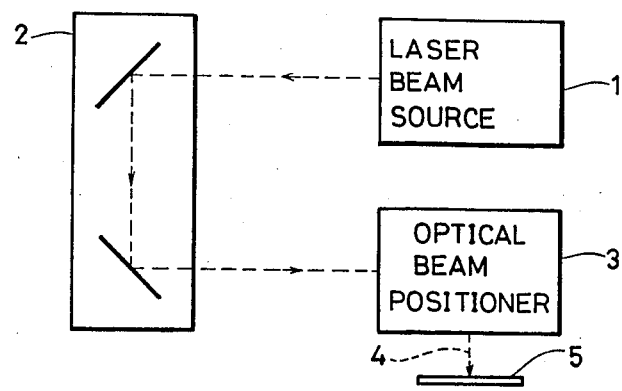
FIG. 1 is a conceptual schematic diagram showing a conventional laser trimming device.
Figure 2:
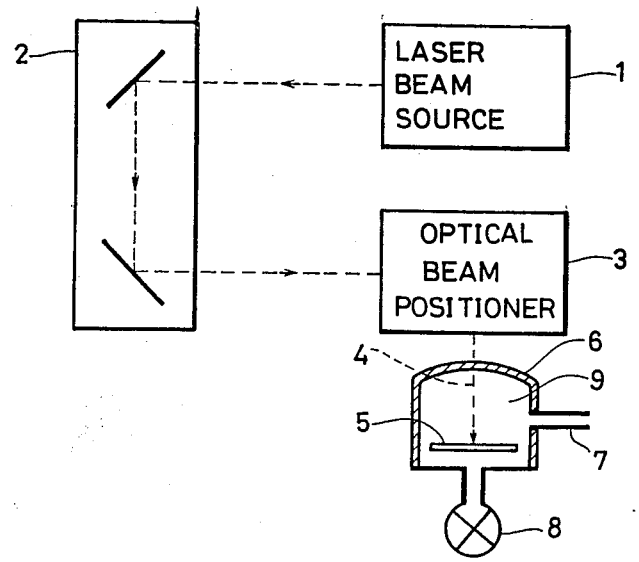
FIG. 2 is a schematic diagram showing definite structure of an embodiment of the present invention.
Figure 3:
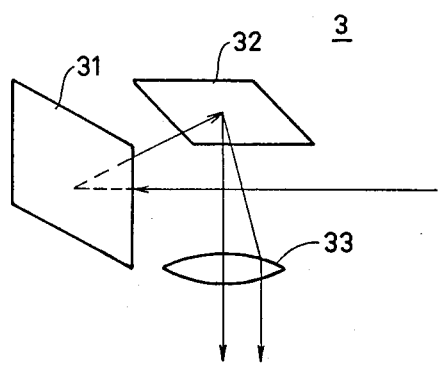
FIGS. 3 and 4 are schematic diagrams showing optical beam positioners employable in the embodiment of the present invention.
Figure 4:
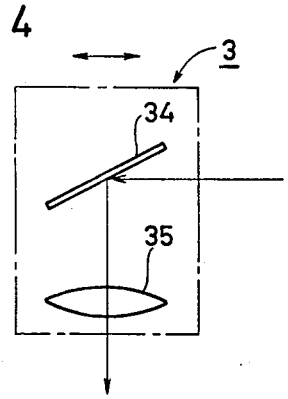

The structure of an embodiment of the present invention is best understood with reference to FIGS. 2–4. A laser beam source 1 and an optical system 2 as shown in FIG. 2 are identical to those of FIG. 1. An optical beam positioner 3 is adapted to scan, by laser beams 4, a wafer position control mark formed on a semiconductor wafer 5 by metal interconnections to detect relative positions of the mark and the coordinate system of the optical beam positioner 3, thereby to irradiate the laser beams 4 on a desired portion. Such an optical beam positioner 3 is implemented as shown in FIG. 3 or 4.

The optical beam positioner 3 as shown in FIG. 3 is formed by a first reflecting mirror 31, a second reflecting mirror 32 and a convex lens 33, and the laser beam 4 emitted from the laser beam source 1 is reflected by the first reflecting mirror 31 to be further reflected by the second reflecting mirror 32, thereby to be focused through the convex lens 33. The first reflecting mirror 31 is rotatable about its vertical axis while the second reflecting mirror 32 is rotatable about its lateral axis, and the laser beam 4 is made to scan the semiconductor wafer 5 by rotation of the first and second reflecting mirrors 31 and 32 at prescribed angles.

The optical beam positioner 3 as shown in FIG. 4 is integrally formed by a reflecting mirror 34 and a convex lens 35, to scan the semiconductor wafer 5 by the laser beams 4 by mechanically moving the reflecting mirror 34 and convex lens 35 in the directions indicated by arrows.

According to the present invention, further, the laser beam 4 position-controlled by the optical beam positioner 3, is irradiated in a chamber 6, which is provided with an oxygen gas inlet port 7 and an exhaust system 8. The inner wall of the chamber 6 is formed, for example, by $SiO_2$ (glass), so that the laser beam 4 position-controlled by the optical beam positioner 3 is inwardly irradiated through the wall of the chamber 6 by setting the laser beam 4 at a wavelength of 1 $\mu$m. The chamber 6 is filled with an oxygen atmosphere 9, and the semiconductor wafer 5 formed with the high melting point metal interconnections is placed in the oxygen atmosphere 9 within the chamber 6.

In the present embodiment, the interior of the chamber 6 is retained in a constant vacuum of, for example, 1 to 10 mTorr. by the exhaust system 8, and oxygen is introduced from the oxygen gas inlet port 7 at a constant low pressure of, for example, 1 to 1.5 Torr. In this state, the laser beam 4 from the laser beam source 1 is irradiated through the optical system 2 and optical beam positioner 3 on the high melting point metal interconnections on the semiconductor wafer 5 placed in the oxygen atmosphere 9 within the chamber 6, thereby to sublimate and cut the high melting point metal interconnections.

Although the oxygen atmosphere is employed in the aforementined embodiment, the atmosphere may be formed by any other gas which can sublimate the high melting point interconnections of, e.g., molybdenum silicide, by irradiation of the laser beam 4. In this case, the molybdenum silicide is not directly sublimated, but partially heated with oxygen $O_2$ by the laser beams 4 so that the part irradiated by the laser beams 4 is converted into $MoO_3$ to be sublimated. The sublimation temperature of $MoO_3$ is about 800° to 1000° C.

The method according to the present invention can also be applied to patterning of a metal thin film having a high melting point.

As hereinabove described, the high melting point metal interconnections formed on the semiconductor wafer 5 are sublimated and cut by the laser beam 4 in the oxygen atmosphere 9, whereby the manufacturing yield of semiconductor devices can be improved without exerting any bad influence on adjacent interconnections and circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Apparatus for cutting metal interconnections having a high melting point, in a semiconductor device, comprising:

containment means for containing a low-pressure gaseous atmosphere comprising oxygen and for containing said semiconductor device within said atmosphere;

means for maintaining said low pressure inside said containment means in a pressure range 1 to 10 mTorr.;

a laser beam source means for providing a laser beam;

optical beam-positioning means for positioning said laser beam to irradiate selected portions of said interconnections of said semiconductor device located in said low-pressure atmosphere within said containment means, whereby said interconnections are sublimated and cut, and a source of oxygen connected to said containment means to deliver oxygen gas thereto at a pressure in the range 1 to 1.5 mTorr.

2. Apparatus according to claim 1, wherein:

said metal interconnections comprise a metal that is oxidized by combining with said oxygen in said low-pressure atmosphere to form a metal oxide which sublimates to generate cuts at said selected portions.

3. Apparatus according to claim 2, wherein:

said laser beam source provides a laser beam capable of generating a local temperature in the range 800° C. to 1000° C. at said irradiated selected portions to effect said oxidation and said sublimation to generate said cuts.

4. Apparatus according to claim 1, wherein:

said metal interconnections comprise a metal that is oxidized by combining with said oxygen in said low-pressure atmosphere to form a metal oxide which sublimates to generate cuts at said selected portions.

5. Apparatus according to claim 4, wherein:

said laser beam source provides a laser beam capable of generating a local temperature in the range 800° C. to 1000° C. at said irradiated selected portions to effect said oxidation and said sublimation to generate said cuts.

* * * * *